(12) United States Patent
Lévai (10) Patent No.: US 11,592,235 B2
(45) Date of Patent: Feb. 28, 2023

(54) METHOD FOR REDUCING THE AMOUNT OF AMBIENT RADIO FREQUENCY ELECTROMAGNETIC AND PULSATING MAGNETIC FIELDS, METHOD FOR DRYING WET WALLS, AND USING THE DEVICE FOR DRYING WET WALLS

(71) Applicant: Sándor Lévai, Alberti Béla utca (HU)

(72) Inventor: Sándor Lévai, Alberti Béla utca (HU)

( * ) Notice: Subject to any disclaimer, the term of this patent is extended or adjusted under 35 U.S.C. 154(b) by 44 days.

(21) Appl. No.: 16/993,904

(22) Filed: Aug. 14, 2020

(65) Prior Publication Data

US 2021/0048246 A1 Feb. 18, 2021

(51) Int. Cl.
*F26B 3/347* (2006.01)
*H05K 9/00* (2006.01)
*E04B 1/70* (2006.01)

(52) U.S. Cl.
CPC ............ *F26B 3/347* (2013.01); *E04B 1/7007* (2013.01); *H05K 9/00* (2013.01)

(58) Field of Classification Search
CPC .......... F26B 3/347; E04B 1/7007; H05K 9/00
USPC ............................................................ 34/255
See application file for complete search history.

(56) References Cited

U.S. PATENT DOCUMENTS

| | | | | |
|---|---|---|---|---|
| 4,350,955 | A * | 9/1982 | Jackson | G01V 3/32 324/303 |
| 5,025,492 | A * | 6/1991 | Viereck | G01S 13/74 342/44 |
| 5,424,515 | A * | 6/1995 | Gentile | F26B 3/347 219/709 |
| 5,710,511 | A * | 1/1998 | Taicher | G01V 3/28 324/303 |
| 6,247,246 | B1 * | 6/2001 | Scalese | G01N 5/045 219/709 |
| 6,348,791 | B2 * | 2/2002 | Shattil | H05K 9/00 324/225 |

(Continued)

FOREIGN PATENT DOCUMENTS

| | | | | |
|---|---|---|---|---|
| EP | 3780405 | A1 * | 2/2021 | E04B 1/7007 |
| WO | WO-9961878 | A2 * | 12/1999 | C07H 11/00 |

(Continued)

*Primary Examiner* — Stephen M Gravini
(74) *Attorney, Agent, or Firm* — Allen, Dyer, Doppelt & Gilchrist, P.A.

(57) ABSTRACT

In a method for reducing the amount of ambient radio frequency electromagnetic and pulsating magnetic fields ("electrosmog"), resonance circuit units placed in a predetermined environment are energized by radio frequency electromagnetic and pulsating magnetic field energy transmitted to the resonance circuits by an electromagnetically connected antenna, at least a portion of energy is consumed as resonance circuit loss, reducing the amount of the ambient fields.

An apparatus implementing the method comprises passive resonance circuits formed by an antenna comprising logarithmic spiral coils with identical or different pitches and passive resonance circuits formed by opposite logarithmic spiral coil panels, the resonance circuits are connected to each other and to the antenna by electrically conductive spacers, a shielding metal plate connected to ground potential is arranged adjacent to the antenna, latter is coaxial with the resonance circuit panels, which are also connected to each other via a supply line.

11 Claims, 3 Drawing Sheets

(56) References Cited

U.S. PATENT DOCUMENTS

| | | | |
|---|---|---|---|
| 7,148,455 B2 * | 12/2006 | Scalese | G01N 5/045 |
| | | | 219/679 |
| 7,555,350 B2 * | 6/2009 | MacDonald | H05K 9/00 |
| | | | 128/908 |
| 10,214,898 B2 * | 2/2019 | Mohorn | H01F 27/02 |
| 10,857,369 B2 * | 12/2020 | Stevenson | H01G 4/35 |
| 2010/0115785 A1 * | 5/2010 | Ben-Shmuel | H05B 6/72 |
| | | | 34/260 |
| 2014/0345152 A1 * | 11/2014 | Ben-Shmuel | H05B 6/6464 |
| | | | 34/255 |
| 2021/0048246 A1 * | 2/2021 | Lévai | F26B 3/347 |

FOREIGN PATENT DOCUMENTS

| | | | | |
|---|---|---|---|---|
| WO | WO-9961878 A3 * | 3/2000 | | C07H 11/00 |
| WO | WO-2019134160 A1 * | 7/2019 | | G01R 33/34 |

* cited by examiner

METHOD FOR REDUCING THE AMOUNT OF AMBIENT RADIO FREQUENCY ELECTROMAGNETIC AND PULSATING MAGNETIC FIELDS, METHOD FOR DRYING WET WALLS, AND USING THE DEVICE FOR DRYING WET WALLS

CROSS-REFERENCE TO RELATED APPLICATION

This application claims the benefit of Hungarian Patent Application No. P1900290, filed on Aug. 14, 2019, the contents of which are herein incorporated by reference in their entirety.

FIELD OF THE INVENTION

The present invention relates reducing ambient radio frequency electromagnetic and naturally occurring magnetic pulsations, and more particularly to methods and apparatus for drying wet walls thereby.

BACKGROUND OF THE INVENTION

Wetting of building foundations and masonry is a common and well-known phenomenon. Causes and possible measures of the phenomenon are well summarized in the article "Waterproofing of building foundations—wall drying by electrochemical method" published in the September 2006 issue of the Hungarian "Ezermester" magazine, the contents of which are also referred to in this description.

Because our buildings are built on the ground, in direct contact with the ground, they become part of the Earth's natural ecosystem. While underground water flows (water level changes, groundwater flows, tidal movement of seas and oceans, etc.) pass through areas of sand, gravel and geological faults containing mineral salts (where different soil layers come into contact with each other due to soil movement or landslides), the dissolved salts having electrochemical properties, generate measurable electrical currents on the earth's surface. These currents are caused by the imbalance of positive and negative charges, the negative charges are fixed by the subsoil particles, while the smaller positive charges continue to flow freely.

Even a slow water leak of a few meters per hour can create electrical voltages and currents that can be measured on the ground surface—these are the so-called spontaneous potentials. Stronger, faster movements generate even more significant effects, such as:

- Magnetic field disturbances: underground watercourses can scatter the Earth's magnetic field, creating intense local magnetic fields. Such water currents do not have to be close to the Earth's surface, but even at considerable depths they can stretch (up to 50 to 100 miles below the surface, which is a short distance relative to the planet) and have a significant effect on the surface.
- Intense electromagnetic activity, magnetic pulsation in the low frequency (LF), very high frequency (VHF), ultra high frequency (UHF) and microwave (C-band) frequency bands, between 30 MHz and 3 GHz.
- Significant accumulation of electrical charge on the ground, in the air and on the walls of buildings.

Such intensively charged areas create local "disturbance zones" or "hotspots" on the surface and, when they touch buildings, induce electrical charges in the walls, filling the bottom of the wall. As a consequence of this, electrical potential difference that can be measured even with a multimeter is generated between the lower and upper part of the wall, and this electrical potential difference creates a direct current (DC) vertical electric field resulting in an upward electromotive force. This creates an osmotic "pumping" effect in the wall that causes the wall to get wet over time.

Neutralizing or reversing these electric and/or magnetic fields in the immediate vicinity of the building will reduce the number and power of the hotspots full of these energies, which results in the cessation of the electromotive force and the osmotic pumping effect, as well as the cessation of the rising humidity.

Magnetic drying systems thus solve the problem of moisture increase from an energy point of view by turning off the stray energy fields that cause rising humidity. Once the primary cause has ceased, the problem of rising humidity is permanently eliminated and the building remains dry as long as the equipment remains in the building.

The potential of wet walls is positive or negative, which is constantly polarized and excited by the electromagnetic field. Thus, to dry wet walls, it is necessary to change the direction of fluid flow caused by electroosmosis.

The potential of a wall can be measured by placing two measuring probes in the wet wall structure, one as a "lower probe" close to the ground and the other as an "upper probe" close to the watering limit. The hydration limit indicates the height of the capillary in which salt water with high content of nitrates is present. Because capillaries are filled with saline water, they are electrically conductive and can be considered electrical resistance, where the magnitude of the electrical resistance is directly proportional to the length of the capillary. A positive or negative voltage can be measured between two points with a voltmeter, which is in the range of 150-300 mV during performed tests. The capillary length of a conductor can be measured in cm, which at certain points is equal to a certain frequency value, for example, a "wavelength" of 21 cm is the length of a conductor approximately equal to a value around the resonant frequency of 1420 Mhz, so that a standing wave with different resonances can develop on the capillary dimensions. Thickness and height of the capillary are also important. The frequency changes as the larger the capillary diameter, i.e., the higher the capillary, the lower its resonant frequency.

EP 3283702 B1 discloses a device for the subsequent dehumidification of wet walls which is suitable for increasing or reversing the intensity of a so-called geogravomagnetic field. According to the—still unproved—theory described in the document, the device obtains the energy necessary for its operation from the fusion reaction of the Earth's hydrogen-containing and plasma-based nucleus. Gravomagnetic waves should be similar to electromagnetic waves, where the electric wave component should be replaced by a gravitational wave component of a different structure. It considers terrestrial radiation to be a gravomagnetic energy field whose magnetoid waves are composed of magnetic and tachyon components. The magnetoid waves penetrate the Earth's crust and the device acts as a gravomagnetic polarizer. The device comprises one or more logarithmic helical coils arranged in a housing based on a calculation, where the geometric design of the spiral coil and, in the case of several coils, the interaction of the coils influence the geogravomagnetic energy field so that its intensity increases or the whole energy field is reversed, and according to the document, both effects result in the removal of moisture from the masonry. The device itself is a microwave transceiver, whose resonant coils and energy-absorbing and transmitting radiating coils are involved in the excitation of the electric field, and the device radiates at least a part of the energy received from the Earth's gravomagnetic field polarized to the wet walls at 1420 MHz in an unknown manner as the device is enclosed in a housing made of aluminum often used for shielding in the world of technology. The indicated frequency is for freshwater, 1360 MHz is for seawater. The disadvantage of this solution, in addition to the fact that there is no scientific explanation or evidence for the nature of the referenced geogravomagnetic field, is basically the lack of the promised effect.

Based on our current scientific and proven knowledge, electroosmotic wall drying technologies use electrical systems that require external, typically electrical, energy to operate, so their long term operation of many months is typically accompanied with the costs of installation and operation.

Although there is a significant need for it, there is no known solution in the art for post-drying wet walls that provides efficient removal of moisture absorbed into the masonry at minimal implementation costs with substantially no additional operating costs.

SUMMARY OF THE INVENTION

Our goal is to create such a device that is understandable and traceable for both professionals and lay users, the implementation and installation of which does not require professional training and architectural preparation, and can be easily and completely reused from the treated dried environment once its work is completed.

Based on the problem outlined and the objectives, we therefore want to create a device that operates "by itself" and for which energy required for operation can be provided from the environment.

As is known in our environment, airspace is increasingly filled with radio frequency electromagnetic vibrations and pulsating magnetic field present in a predetermined environment up to several GHz frequencies. We have recognized that wet masonry must be "freed" from the electromagnetic field caused by these radio frequency electromagnetic vibrations and pulsating magnetic fields.

Radio frequency electromagnetic vibrations are also often referred to as electrosmog. Although the term refers to smog to have some harmful effects on health, the term electrosmog is essentially a collective term. On the website of the Hungarian National Media and Infocommunications Authority (http://nmhh.hu/szakmai-erdekeltek/hirkozles-felugyelet/elektro-szmog), the term electrosmog is defined as follows:

"We are exposed to countless types of radiation from our environment. The Earth's magnetic field, lightning-generated waves and electromagnetic radiation from outer space are of natural origin, while radio and TV broadcasting, as well as signals from mobile phones, electric machines and microwaves, and the waves generated by electrical machines and motors are the result of human activity. The latter radiation is commonly known as electrosmog."

Together, these vibrations, which are insignificant in terms of energy, can mean energy that can already be taken into account. Persons and objects, such as wet walls, are surrounded by electrosmog, which is an electromagnetic field and pulsating magnetic field composed of vibrations of different frequencies. In a wall structure there are capillaries of different diameters and lengths in which there is water. Nitrate (salt) is present in dissolved state, which determines the electrical resistance value. There is a straight relationship between the capillary length and the resistance value. Capillaries of different diameters and lengths thus have different resistance values and operate at different resonance points in the wall structure. The frequency changes, the larger the capillary diameter, the longer the capillary, the lower the resonant frequency, which determines the value of the resonance.

We have discovered that energy can be collected and utilized from the resonance points and the pulsating magnetic field of the electrosmog to treat these resonance points.

Based on this, the task to be solved can be defined as to create a structure with which we can collect as much energy as possible in the surrounding electrosmog so as to reduce the energy of the remaining electrosmog so that it can have as little effect as possible moisture penetration or absorption into the masonry. To do this, energy must be drawn at the resonance points that also excite the saline-water capillaries in the wall and consumed by the device.

The operating principle of the device according to the invention is thus completely different from the operating principle of the prior art device mentioned in the introduction, since it operates by selecting and utilizing a resonance point determined from different resonant points of the pulsating electromagnetic field or electrosmog around it.

The object is achieved, according to an embodiment of the present invention, by a method for reducing the amount of ambient radio frequency electromagnetic and pulsating magnetic fields, comprising the steps of arranging at least one resonance circuit in a radio frequency electromagnetic and pulsating magnetic field present in a predetermined environment, supplying the resonance circuit with an antenna being in electromagnetic communication with it, supplying a plurality of resonance circuits with the energy of the ambient radio frequency electromagnetic and pulsating magnetic field transmitted by the antenna unit to the resonance circuit, and consuming at least a part of the radio frequency electromagnetic and pulsating magnetic field energy as a loss in the resonance circuits, thereby reducing the amount of the electromagnetic and pulsating magnetic fields.

An apparatus for performing this method comprises a casing permeable for electromagnetic radiation, an antenna, and at least one passive resonance circuit panel, wherein the panel of the passive resonance circuit includes a coil unit panel comprising at least one approximately logarithmic spiral coil, spacers mechanically fastening the at least one passive resonance circuit panel to each other and to the antenna panel, a shielding metal plate arranged adjacent to the antenna coil panel. The apparatus comprises at least two passive resonance circuits panels, wherein one passive resonance circuit panel includes two coil unit panels, joined with their backs, having identical parameters and comprising centrally symmetrical, four-pole, catenated logarithmic spiral coils, where the logarithmic spiral coils formed on the coil unit panels joined with their backs comprising threads oriented in the opposite direction, a further passive resonance circuit panel includes two coil unit panels, joined with their backs, each coil unit panel comprising a centrally symmetrical, unipolar logarithmic spiral coil, where the logarithmic spiral coils formed on the coil unit panels joined with their backs having different pitches, and the coil with a higher pitch is arranged facing the adjacent coil unit panel of said passive resonance circuit panel, and the two passive resonance circuits panels are connected to each other via a coaxial supply line and the further resonance circuit panel is connected to the antenna via the coaxial supply line in such a manner that the coil unit panel of the antenna facing the shielding metal plate is connected via the coaxially inner conductive core of the supply line to the coil unit panel of the adjacent passive resonance circuit facing the shielding metal plate and to the coil unit panel of the further resonance circuit panel facing away from the shielding metal plate, the coil unit panels, facing each other, of the two adjacent passive resonance circuits are connected by the coaxially outer conductive sheath of the supply line, the resonance circuit panels and the antenna are fixed to each other by electrically conductive spacers, the antenna is connected to the shielding metal plate by electrically conductive spacers, and the shielding metal plate is connected to ground potential.

The invention will now be described in more detail with reference to a possible embodiment, with reference to the accompanying drawing, in which:

DETAILED DESCRIPTION OF PREFERRED EMBODIMENTS

In carrying out the method, resonance circuit units 2, 3 and an antenna 4 connected to them in the device, which will be described in more detail later, are placed in a predetermined environment, for example in a building where wall wetting is experienced. With the antenna 4 the electrosmog, i.e. a radio frequency electromagnetic and pulsating magnetic field is received and the received energy is transferred to the passive resonance circuit units 2, 3 connected to the antenna 4. In present example said passive resonance circuit units 2, 3 are LC circuits. In the passive resonance circuit units 2, 3 the energy is at least partially converted by the resonance into resonance circuit loss and heat, thus reducing the amount of ambient radio frequency electromagnetic and pulsating magnetic fields to an extent that is not physically perceptible but can be experienced.

Figure 1:
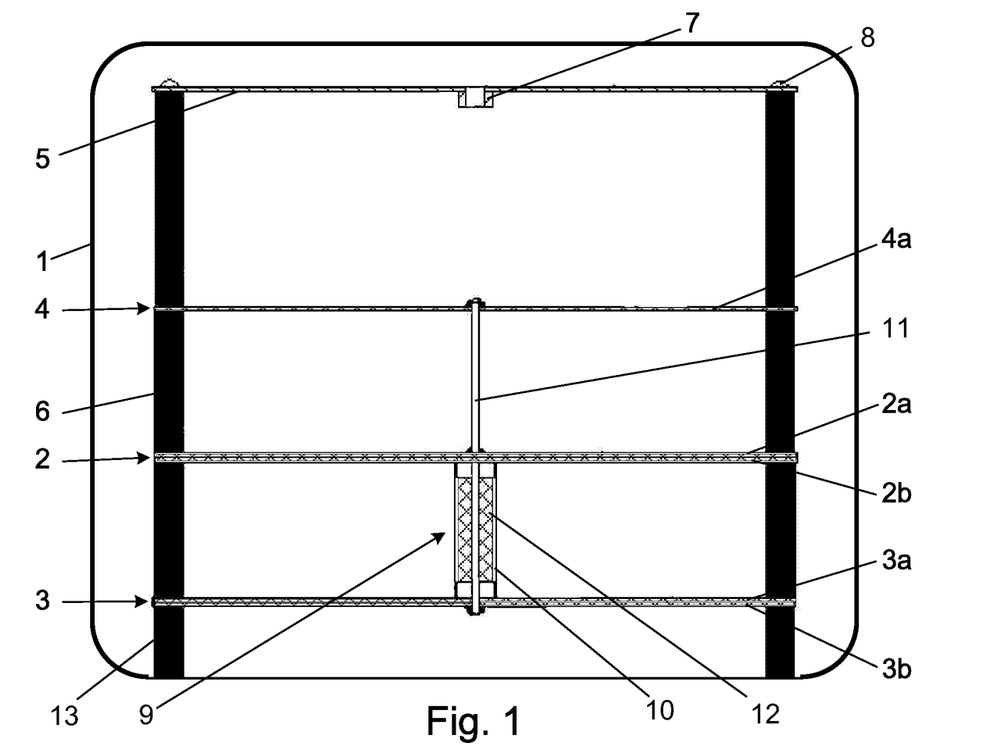
FIG. 1 shows a schematic vertical section of an exemplary embodiment of the device according to the invention.

FIG. 1 shows the structure of an exemplary embodiment of the proposed device by means of a schematic vertical section. The individual components are for better comprehensibility and easier representation not fully scaled, but this does not impede understanding of structure and operation.

The exemplary device has a symbolically indicated casing 1 which is made of a material which transmits electromagnetic field around it, so that electromagnetic field is also present inside the casing 1. Such a material can be wood, antistatic plastic, glass, etc., in addition to the function, mechanical protection and aesthetic aspects can be and should be taken into account, which can be considered a routine activity for a person skilled in the art.

Inside the casing 1, in the case of the embodiment shown, two resonance circuit panel units 2, 3 and an antenna 4, which will be described in more detail below, are arranged one above the other. The resonance circuit panel units 2, 3, the antenna 4 and a shielding metal plate 5 are connected and held at a predetermined distance from each other by spacers 6. In the example shown, four spacers 6 are used, which are distributed along the circumference of the substantially round resonance circuit panel units 2, 3, i.e. at a distance of 90° from each other, but a different number of spacers 6 can also be used.

The spacers 6 also have the function of directing the static charge generated on the resonance circuit panel units 2, 3 and the antenna panel 4 onto the shielding metal plate 5 arranged above the antenna 4. This is ensured by the fact that the spacers 6 are made of an antistatic but electrically conductive material, such as some plastics known and used in the art, and the specific type of plastic can be selected from the current material supply to the knowledge of a person skilled in the art. The shielding metal plate 5 enables connecting to ground to drain the static charge generated at different points of the device. In the present example the shielding metal plate 5 comprises a threaded hole 7 for connection, and the shielding metal plate 5 can even be designed as an upper closure for the casing 1. In the present example, the shielding metal plate 5 is 1 mm thick semi-rigid aluminum and is fastened to the spacers 6 by screws 8. The threaded hole 7 can even be used to suspend or mount the device from above.

Each resonance circuit panel unit 2, 3 in the embodiment shown comprises two mated and adjusted single-sided printed circuit boards, each of which is designed as a coil unit panel 2a, 2b, 3a, 3b. The antenna 4 is formed as a coil unit panel 4a.

The resonance circuit panels 2 and 3 are connected to each other by a coaxial supply line 9. An outer sheath 10 and an inner core 11 of the coaxial supply line 9 are made of an electrically conductive material, in this example copper.

The inner core 11 is formed by a wire with a diameter of 3 mm, the outer sheath 10 in the example shown is 15 mm in diameter and the space between the two is filled with an insulating material 12, such as a material used in the manufacture of coaxial cables, such as Teflon. The lower end of the outer sheath 10 is soldered to the panel of the upper coil unit 2a of the resonance circuit unit 2, and its upper end is mechanically in contact with the panel of the lower coil unit 3b of the resonance circuit unit 3. The lower end of the inner core 11 is soldered to the lower coil unit panel 2b of the resonance circuit panel unit 2, its intermediate section is soldered to the upper coil unit panel 3a of the resonance circuit panel unit 3, the upper end is connected to the antenna panel 4, more specifically to the coil unit panel 4a. During operation of the device the antenna panel 4 carries the signal of the coil unit panel 4a to the coil unit panels 2a, 2b, 3a, 3b.

In the present example, the lowest resonance circuit panel unit 2 rests on legs 13 having a design similar to the spacers 6, but are shorter. In the embodiment shown a leg 13 is approximately 50 mm long, a spacer 6 between the resonance circuit panel units 2 and 3 is approximately 70 mm and a spacer 6 between the 4 antenna panels and the 5 shielding metal sheets about 50 mm. The device itself is sized so that its casing 1 can accommodate 2, 3 resonance circuit panels and the 4 antenna panel with a diameter of about 260 mm.

In the example shown, the passive resonance points formed during operation on the resonance circuit panel units 2, 3 are generated by the logarithmic spirals 2c, 2d, 3c, 3d of the coil unit panels 2a, 2b, 3a, 3b of the resonance circuit panel units 2, 3. Editing of logarithmic spirals 2c, 2d, 3c, 3d is well known from the literature, see e.g. Miklós Hámori: "Proportions and riddles", Magyar Világ Kiadó, Budapest, 2002, or Eric W. Weisstein: "Logarithmic Spiral", http://mathworld.wolfram.com/LogarithmicSpiral.html. The passive resonance points are provided by inductances and capacitances created by logarithmic helical right-handed and left-handed conductor tracks formed on the coil unit panels 2a, 2b, 3a, 3b in a manner known from electrical engineering, in the areas of intersection of the conductor tracks of the logarithmic spirals 2c, 2d, 3c, 3d formed on the coil unit panels 2a, 2b, 3a, 3b of the resonance circuit panel units 2, 3 joined with their backs.

The different capacitance values at said intersection points are generated according to the thickness of the resonance circuit panel units 2, 3, which can be considered as insulating material, and the surface size of the conductor tracks. In the example shown, the resonance circuit panel units 2, 3 and the antenna 4 are made of a commercially available epoxy or fiberglass printed circuit board having a thickness of 1.5 mm for a single-sided sheet and 3.1 mm for a double-sided sheet. The copper foil can be 15-40 µm thick, which can affect the efficiency of the device. The exact shape of the panels used is irrelevant, preferably adapting to the shape of the casing 1.

According to the example, a total of five printed circuit boards are used: one respective resonance circuit panel unit 2, one respective resonance circuit panel unit 3 and one antenna panel 4. Our experiments show that the device works even with fewer or more printed circuit boards but this less preferred because the bandwidth will be narrower. Working and effect of the resonance circuit panel unit 2 starts from a low resonance point of approximately 1 MHz to an intermediate frequency value, approximately 60 MHz, while working and effect of the other resonance circuit panel unit 3 starts from 21 MHz and lasts to an upper resonance point of approximately 1440 MHz, always being higher than the intermediate value. The resonance circuit panel units 2, 3 thus together provide a higher, targeted bandwidth. Several resonance circuit panel units 2, 3 with different designs can be used, the more panels are used, the more resonance points will be displayed, the less panels are used, the total bandwidth will be smaller.

FIGS. 2-7 show an exemplary design of the coil unit panels 2a, 2b, 3a, 3b, 4a. The coil unit panels 2a, 2b, 3a, 3b shown have a rectangular shape with rounded corners but other shapes may be used as long as they fit inside the casing 1. In the region of the corners, holes 14 are formed for fixing the spacers 6.

Figure 2:
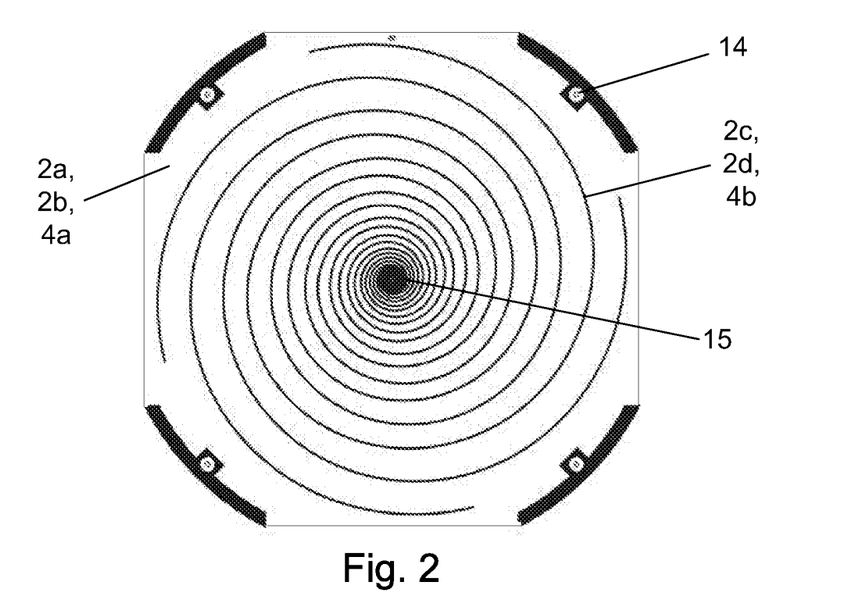
FIG. 2 shows a coil unit panel of an antenna panel used in the apparatus of FIG. 1 and coil unit panels of a resonance circuit panel.
Figure 3:
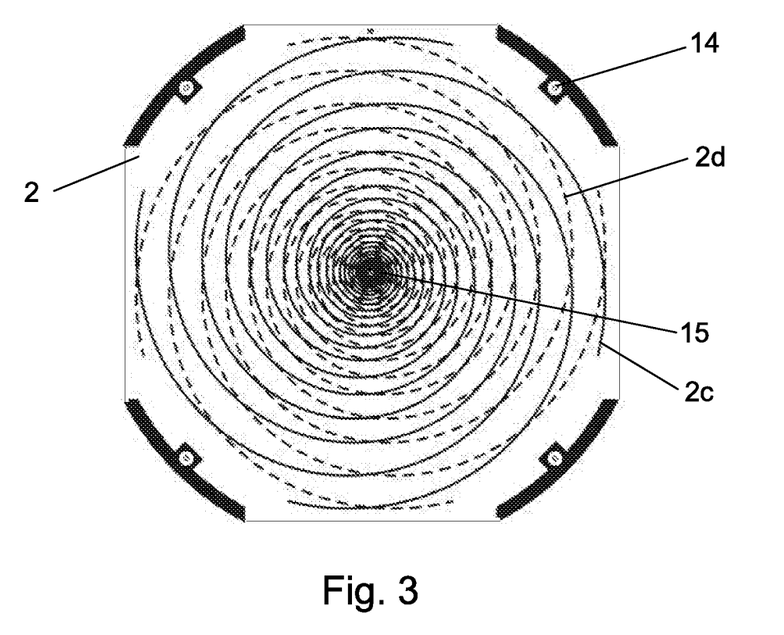
FIG. 3 shows a resonance circuit panel composed of the coil unit panels facing away from each other shown in FIG. 2, with the passive resonance points formed thereon.
Figure 4:
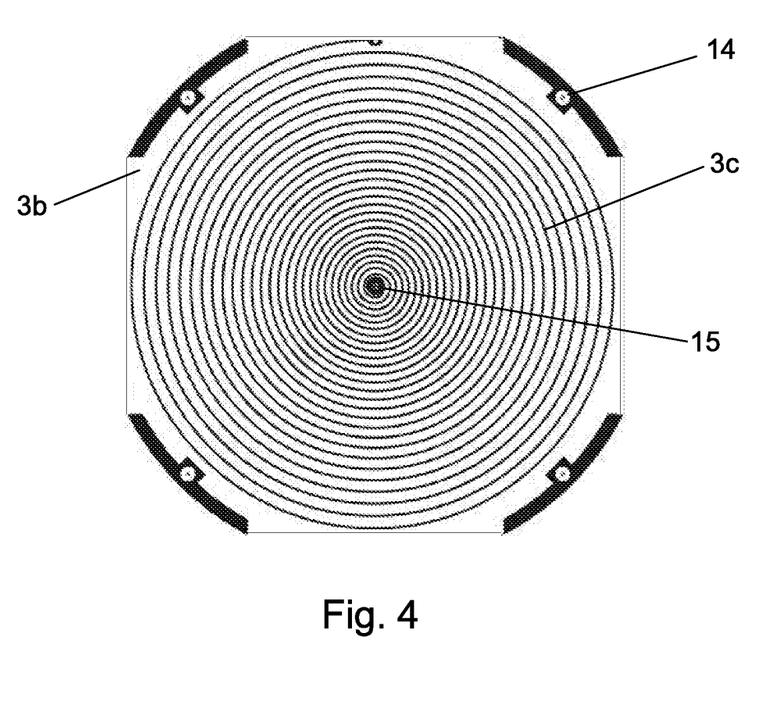
FIG. 4 shows a panel of a coil unit of a further resonance circuit panel used in the device of FIG. 1.
Figure 5:
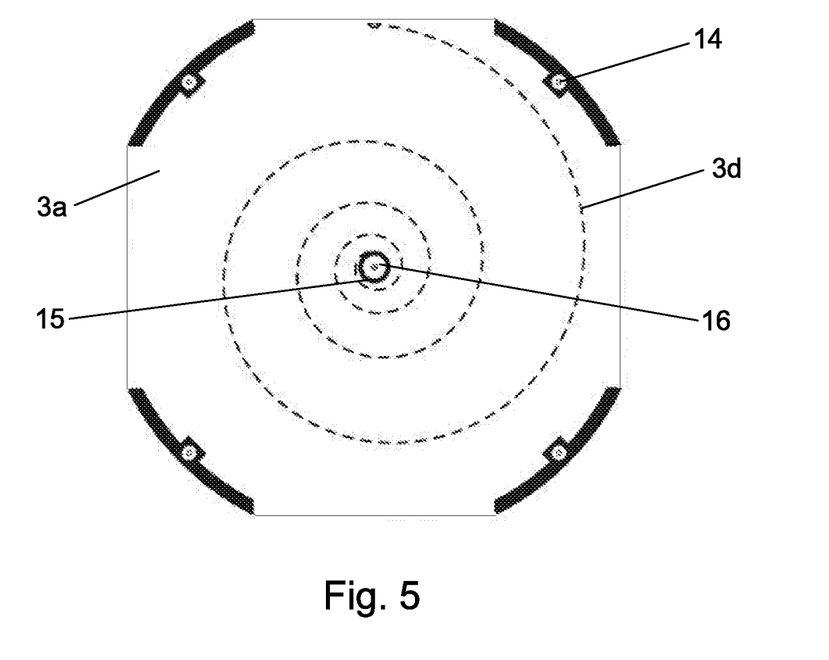
FIG. 5 shows a panel of another coil unit of a further resonance circuit panel used in the apparatus of FIG. 1.
Figure 6:
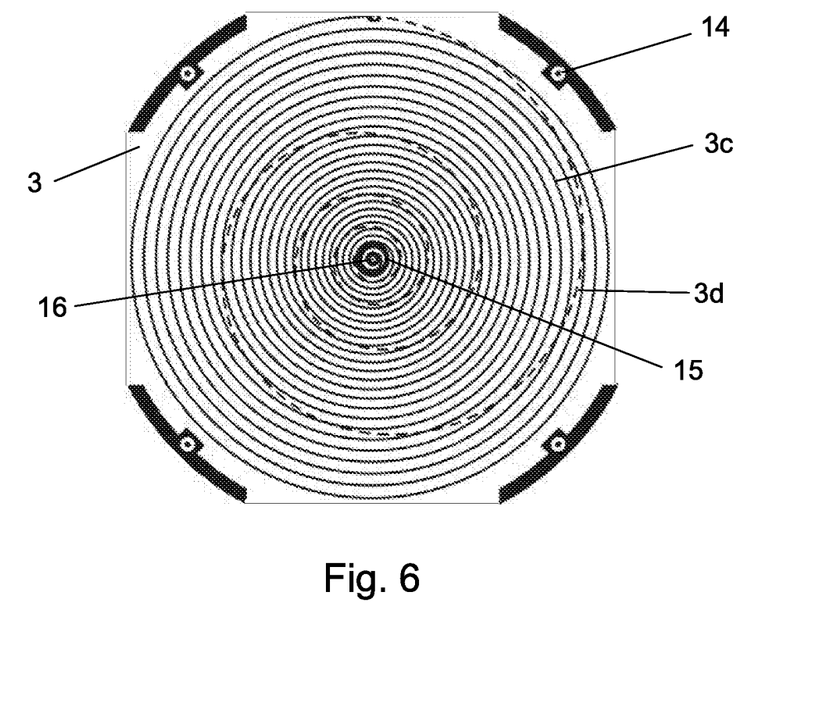
FIG. 6 shows a resonance circuit panel composed of the coil unit panels facing away from each other shown in FIG. 4 and FIG. 5, with passive resonance points formed thereon.

From the coil unit panels 2a, 2b, 3a, 3b, the coil unit panels 2a, 2b and the coil unit panel 4a are formed identically, see FIG. 2: symmetrical, right-hand helical coils with four-start, i.e., four-pole with an offset of 90° and a pitch of log 60-80 are provided. The width of the coils can be between 2-4 mm, in this example 3 mm. The coil unit panel 3a is formed as a single-pole coil with a pitch between log 9-12, see FIG. 4, while the coil unit panel 3b is formed as a single-pole coil with a pitch between log 60-80, see FIG. 5, to produce passive resonance circuits in a lower frequency range as previously indicated.

By placing the right-hand helical coil unit panels 2b, 3b onto the back of the coil unit panels 2a, 3a—by this inversion the originally right-handed helical coils will become left-handed helical coils—and centering them, passive resonance circuits will be created required for the operation of the device where proper positioning ensures that the logarithmic spirals intersect properly. This can be seen in FIG. 3 and FIG. 6, respectively, where the logarithmic spiral 2c of the coil unit panel 2a is shown by a solid line, the logarithmic spiral 2d of the coil unit panel 2b is shown by a dashed line, the logarithmic spiral 3c of the coil unit panel 3a is shown by a solid line and the logarithmic spiral 3d of the coil unit panel 3b is shown with a dashed line so that passive resonance points formed by the intersections of the conductive logarithmic spirals 2c, 2d, 3c, 3d can be easily recognized. The capacitance values at each intersection are given by the distance between the two spirals 2c and 2d, 3c and 3d and the size of the intersecting surface and are in the range of 2-10 pF for the indicated geometric design. The value of the capacities connected in parallel will be added up, the value of the total capacity is around 210-220 pF. The inductance required to form passive resonance circuits is determined by the length and cross section of the spiral formed by the copper conductor.

In the middle of each coil unit panel 2a, 2b, 3a, 3b, 4a there is a continuous central area 15 consisting of a continuous round layer of electrically conductive copper foil, and the logarithmic spiral coils 2c, 2d, 3c, 3d start from this central area 15 in accordance with four-start, i.e. four-pole design of 90°. In the center of the coil unit panels 2a, 2b, 3a, 3b, 4a, a 3 mm hole 16 is formed for the copper conductor forming the core 11 of the coaxial supply line 9, which mechanically fits with it but does not provide electrical connection per se.

In the device shown, the antenna 4 collects the electrosmog and transmits it to the two resonance circuit panel units 2, 3 underneath, to which it is connected via a copper conductor forming the core 11 of the coaxial supply line 9. The resonance panel unit 2 is arranged below the antenna 4, and the resonance circuit panel unit 3 is arranged below the resonance panel unit 2. The coil unit panel 2b of the resonance circuit panel unit 2 faces downward toward the resonance circuit panel unit 3 in the position shown in FIG. 1, and the coil unit panel 3a of the resonance circuit panel unit 3 faces upward toward the resonance circuit panel unit 2.

During the operation of the device, the designed, constructed and assembled, precisely coordinated passive resonance circuit coils are powered and activated by the ambient electromagnetic field, thus exciting a passive resonance circuit in the full bandwidth at the points corresponding to the resonance and thus the device draws energy from the surrounding electromagnetic field for its operation. This detraction can be considered as would the device "filter" the electromagnetic field at the resonance points in its vicinity, in other words, it acts as a resonant frequency filter. The evaluation of the resonance points, the operation of the device and the achieved effect can be clearly detected and measured with a spectrum analyzer and a three-axis line of magnetic force meter. Passive resonance points are designed to operate at resonance values, resulting in less and less energy reaching the wall that would increase the positive or negative charge in the wall structure. This reduces the wall potential and the charge value because it does not receive enough constant energy from the electromagnetic field of different resonances. As a result, hydration in the capillaries decreases continuously, gradually receding slowly.

The inductance and capacitance, i.e. the resonant frequency range of the coils arranged in parallel and electrically isolated from each other, are influenced by the dimensions of the coil. The resonance circuits 2, 3 can be tuned by rotating the coil panels 2a, 2b and 3a, 3b for setting the resonance points for water-filled capillaries of varying diameters. For example, a commercially available broadband spectrum analyzer, such as an instrument of type "IDA 2"

from Narda Safety Test Solutions GmbH, Germany, can be used, which is capable on the one hand to output a signal mimicking electrosmog in the preferred frequency range, i.e. in the range 30-1440 MHz output and on the other hand to monitor and measure the signal range. The signal is first measured in the absence of the device according to the invention, then the device is placed within the range of the spectrum analyzer and the change in signal strength achieved by the device placed within the range of the spectrum analyzer by said tuning is monitored. When a value considered acceptable is reached, the positioning is finalized, for example, by fixing the coil panels 2a, 2b and 3a, 3b together, e.g. by gluing.

The passive resonance circuits of the device consume energy from the electromagnetic field at the experimented resonance points. This attenuates the effect of the electromagnetic field on the wall potential, reducing it to varying degrees. At the empirically determined resonance points of the wall structure, the energy supply from the electromagnetic field is not continuous, but intermittent, ie not all oscillating circuits work at the same time. The extent of energy consumption depends on the amount of energy that occurs. If an electromagnetic field is present at a given resonance point for a longer period of time, then the passive resonance circuit of the device operates continuously and consumes energy for a longer period of time. Although the effect of the electromagnetic field on the wall potential has replenishment, it is not continuous.

The device shown is hung with an electrically conductive wire, chain, hook, etc. The range of this device is about 7 m, the wet walls must be within this range. In the case of a longer wall to be dried to a greater extent, several devices must be placed at a suitable, empirical distance.

As a result of air flow, the coil unit panels 2a, 2b, 3a, 3b, 4a tend to be statically charged, which must be conducted. For this purpose, the antistatic spacers 5 described above provide connection to the shielding metal plate 5 and the latter, as described, is in electrical connection with the ground so that static charge can be conducted to ground potential.

The casing 1 of the device can be painted and decorated without restriction.

After placing the device according to the invention in a given space or area to be treated, the previously outlined measurement also proved that the measured values changed in a negative direction. In the capillaries in the aqueous wall, the fluid flow is directly proportional to the wall potential, so if the measurable potential difference decreased, the fluid flow also changed according to the external electric field affected by the device, and moisture did not reach the wall capillaries.

The advantages of the device according to the invention are that, by consuming, drawing energy from the electromagnetic field at selected resonant points, its resonance circuits damp the effect of the electromagnetic field on the wall potential, consuming it to different degrees.

Another important advantage is that no external energy source is required for the operation of the device, nor does it require any treatment, so it evokes its effect without expertise or human intervention, even in empty or abandoned facilities.

LIST OF REFERENCE SYMBOLS 1 casing
2 resonance circuit
2a, 2b coil unit panel
2c, 2d logarithmic spiral
3 resonance circuit
3a, 3b coil unit panel
3c, 3d logarithmic spiral
4 antenna
4a coil unit panel
4b logarithmic spiral
5 shielding metal plate
6 spacer
7 threaded hole
8 screw
9 coaxial supply line
10 sheath
11 core
12 insulating material
13 foot
14 hole
15 central area
16 hole

What is claimed is:

1. A method for reducing a strength of an ambient radio frequency electromagnetic and pulsating magnetic field, comprising the steps of:
    arranging a plurality of resonance circuits and an antenna in electromagnetic communication with the plurality of resonance circuits in the ambient radio frequency electromagnetic and pulsating magnetic field;
    supplying the plurality of passive resonance circuits with energy of the ambient radio frequency electromagnetic and pulsating magnetic field transmitted by the antenna to the plurality of passive resonance circuits, and consuming at least a part of the energy of the radio frequency electromagnetic and pulsating magnetic field as a loss in the plurality of passive resonance circuits, thereby reducing the strength of the electromagnetic and pulsating magnetic fields;
    applying in the plurality of passive resonance circuits at least two LC circuits, each of the LC circuits including at least two approximately logarithmic helical spirals, the at least two approximately logarithmic helical spirals of each of the at least two LC circuits being identical but opposite-handed, an inductance of each of the at least two LC circuits being defined by turns of the at least two approximately logarithmic helical spirals, and a capacitance of each of the at least two LC circuits being defined by intersecting turns of the at least two of the logarithmic helical spirals acting as an armature of a capacitor, the at least two LC circuits being arranged in parallel and electrically isolated from each other such that the at least two LC circuits have different resonant frequencies;
    covering, between the at least two LC circuits having different resonant frequencies, a resonant frequency range of 1 megahertz (MHz) to 1,440 MHz in a partly overlapping manner; and
    adjusting the resonant frequency range covered by the at least two LC circuits to determine a maximum reduction in the strength of the ambient radio frequency electromagnetic and pulsating magnetic field achievable by the plurality of passive resonance circuits by rotating the at least two approximately logarithmic helical spirals of each of the at least two LC circuits relative to each other.

2. The method according to claim 1, wherein the least two approximately logarithmic helical spirals of at least one of the at least two LC circuits are four-pole spirals.

3. The method according to claim 1, wherein electrostatic charge of the plurality of passive resonance circuits is neutralized by connection to ground potential.

4. An apparatus for reducing ambient radio frequency electromagnetic and pulsating magnetic fields, comprising:
a casing permeable to electromagnetic radiation;
an antenna including an antenna coil panel;
at least first and second passive resonance circuit panels;
a shielding metal plate arranged facing the antenna coil panel, the first passive resonance circuit panel being closer to the shielding metal plate than the second passive resonance circuit panel;
electrically conductive spacers mechanically fastening the second passive resonance circuit panel to the first passive resonance circuit panel, fastening the first passive resonance circuit panel to the antenna and fastening the antenna to the shielding metal plate; and
a coaxial supply line having a coaxially inner conductive core and a coaxially outer conductive sheath, the coaxially inner conductive core being connected to the antenna coil panel;
wherein the first passive resonance circuit panel includes a first two coil unit panels joined back-to-back each of the first two coil until panels comprising, a four-pole, catenated logarithmic spiral coil, the logarithmic spiral coils of the first two coil unit panels having identical parameters but being opposite-handed, one the first two coil unit panels facing toward the shielding metal plate and being connected to the coaxially inner conductive core and a further one of the first two coil unit panels facing the second passive resonance circuit panel and being connected to the coaxially conductive sheath of the coaxial supply line;
wherein the second passive resonance circuit panel includes a second two coil unit panels, joined back-to-back, each of the second two coil unit panels comprising a unipolar logarithmic spiral coil, where the logarithmic spiral coils formed on the second two coil unit panels have different pitches, and one of the second two coil unit panels having the unipolar logarithmic spiral coil with a higher pitch is arranged facing the adjacent further one of the first two coil unit panels of said first passive resonance circuit panel and is connected to the coaxially outer conductive sheath coaxial supply line, a further one of second two coil unit panels having the unipolar logarithmic spiral coil with a lower pitch is connected to the coaxially inner conductive of the coxial supply line; and
wherein the shielding metal plate is connected to ground potential.

5. The apparatus according to claim 4, wherein the first two coil unit panels of the first resonance circuit panel are each formed on a 1.5 mm-thick single-sided printed circuit board.

6. The apparatus according to claim 4, wherein the first two coil unit panels of the first resonance panel are formed, respectively, on opposite sides of a 3.1 mm-thick double-sided printed circuit board.

7. The apparatus according to claim 5, wherein the first two coil unit panels of the first resonance panel further comprise a copper conductive film with a thickness of 0.015 to 0.040 mm.

8. The apparatus according to claim 4, wherein the first and second resonance circuit panels are configured to jointly cover a frequency range of 30 megahertz (MHz) to 1420 MHz.

9. The apparatus according to claim 4, wherein a lid of the casing is formed by the shielding metal plate.

10. A method for drying wet walls, wherein a strength of an ambient radio frequency electromagnetic and pulsating magnetic field causing electroosmosis in a wall to be dried is reduced using a method according to claim 1.

11. A method for drying wet walls comprising using the apparatus of claim 4 to reduce a strength of an ambient radio frequency electromagnetic and pulsating magnetic field causing electroosmosis in a wall to be dried.

* * * * *